United States Patent
Yee et al.

(10) Patent No.: US 7,285,971 B2
(45) Date of Patent: Oct. 23, 2007

(54) INTEGRATED CIRCUIT (IC) TEST ASSEMBLY INCLUDING PHASE CHANGE MATERIAL FOR STABILIZING TEMPERATURE DURING STRESS TESTING OF INTEGRATED CIRCUITS AND METHOD THEREOF

(75) Inventors: Pak Hong Yee, Pandan Valley (SG); Wuu Yean Tay, Singapore (SG)

(73) Assignee: Micron Technology, Inc., Boise, ID (US)

( * ) Notice: Subject to any disclaimer, the term of this patent is extended or adjusted under 35 U.S.C. 154(b) by 152 days.

(21) Appl. No.: 11/197,823

(22) Filed: Aug. 5, 2005

(65) Prior Publication Data

US 2005/0270051 A1    Dec. 8, 2005

Related U.S. Application Data

(62) Division of application No. 10/883,487, filed on Jul. 1, 2004, now Pat. No. 7,030,640.

(30) Foreign Application Priority Data

May 9, 2004    (SG) ................................ 200401161

(51) Int. Cl.
    *G01R 31/02* (2006.01)
(52) U.S. Cl. ..................................... 324/760
(58) Field of Classification Search ................ 324/760, 324/765, 158.1, 763; 361/704, 699; 257/714, 257/48; 165/80.2, 80.3, 46
See application file for complete search history.

(56) References Cited

U.S. PATENT DOCUMENTS

| | | |
|---|---|---|
| 4,324,285 A | 4/1982 | Henderson |
| 4,630,355 A | 12/1986 | Johnson |
| 4,871,965 A | 10/1989 | Elbert et al. |
| 5,205,132 A | 4/1993 | Fu |
| 5,831,831 A | 11/1998 | Freeland |
| 6,060,895 A | 5/2000 | Soh et al. |
| 6,410,982 B1 | 6/2002 | Brownell et al. |
| 6,535,388 B1 | 3/2003 | Garcia |

(Continued)

FOREIGN PATENT DOCUMENTS

WO    WO 02056040 A1    7/2002

(Continued)

OTHER PUBLICATIONS

Chip-Level Embedded Temperature Stabilization Ensures High Accuracy, Low Cost-of-Test, Credence Systems Corporation, Fremont, CA, pp. 1-8.

(Continued)

*Primary Examiner*—Ha Tran Nguyen
*Assistant Examiner*—Tung X. Nguyen
(74) *Attorney, Agent, or Firm*—Dinsmore & Shohl LLP

(57) ABSTRACT

A testing apparatus and method for testing integrated circuits is disclosed wherein a device under test is continuously maintained at a desired set point temperature by an included thermal body. The thermal body has an enclosed phase change material which provides latent heat to the device under test such that there is negligible temperature variation realized by integrated circuits being tested.

8 Claims, 3 Drawing Sheets

U.S. PATENT DOCUMENTS 6,625,558 B1    9/2003    Van Ausdall et al.

FOREIGN PATENT DOCUMENTS

| WO | WO 03/027695 A1 | 4/2003 |
| WO | WO 03057795 A1 | 7/2003 |

OTHER PUBLICATIONS

Wartenberg, Scott, "Contactor Design for Hign-Volume RF Testing", Microwave Product Digest, Feb. 2003, pp. 1-8.

Pfahnl, Andreas C. et al., "Thermal Management and Control in Testing Packaged Integrated Circuit (IC) Devices", SAE International, 34th Intersociety Energy Conversion Engineering Conference, Aug. 2-5, 1999, pp. 1-9.

INTEGRATED CIRCUIT (IC) TEST ASSEMBLY INCLUDING PHASE CHANGE MATERIAL FOR STABILIZING TEMPERATURE DURING STRESS TESTING OF INTEGRATED CIRCUITS AND METHOD THEREOF

CROSS REFERENCE TO RELATED APPLICATIONS

This application is a division of U.S. patent application Ser. No. 10/883,487 filed Jul. 1, 2004, now U.S. Pat. No. 7,030,640 which is based on and claims priority to Singapore patent application Serial No. 2004001161-S filed Mar. 9, 2004.

FIELD OF THE INVENTION

The present invention relates to the field of testing integrated circuits, and more particularly, to a testing apparatus and method of maintaining a substantially constant temperature of a semiconductor device under test using phase change materials.

BACKGROUND OF THE INVENTION

Semiconductor devices typically undergo a variety of stress test procedures, including short-circuit tests, burn-in tests, and device functional tests to insure their proper operation. During such stress testing, it is important that the temperature of the semiconductor device under test, which is commonly called DUT, be held at a substantially constant value.

An integrated circuit (IC) tester, which applies a test signal of a predetermined pattern and measures the electrical characteristics of the DUT, is typically operated at various temperatures in order to perform such stress testing procedures. Many IC testers use a IC test assembly, such as for example, a lead pusher and insert, to bring the DUTs into electrical contact with a tester head in a test section of the IC tester. However, the temperature within the test section is normally unstable, and varies within some tolerance as graphically depicted by FIG. 1, for an illustrated desired set point temperature of 90° C.

As illustrated, typically a heater provided in the test section of the IC tester, will heat until the desired set point temperature is reached, wherein a thermostat after sensing this temperature will turn the heater off. However, the latent heat of the heater typically causes a spike in the temperature, overshooting the desired set point temperature. Likewise, when the temperature within the test section falls below the set point temperature, the delay in the thermostat to turn on the heater and the delay to heat the heater, causes the temperature within the test section to dip below the set point temperature. As a result of this heater-thermostat action or heating-cooling cycle, IC device performance may be less than optimal and inaccurate.

Additionally, it is known that the DUTs self-heat, and that the resulting rise in temperature may cause the performance of some of the DUTs to degrade. This may cause further under-reporting of the performance of the DUTs. Various temperature forcing techniques have been used in an attempt to maintain the temperature of the DUT around a constant set-point. However, with many current semiconductor devices, instantaneous power fluctuations may be so severe and dramatic, that current temperature forcing systems often fail to accurately offset the effects of self-heating.

Furthermore, the lack of a suitable heat sink contacting each DUT in the IC tester has resulted in localized temperature variations at each DUT. These localized temperature variations or hot spots has caused the device temperature of some DUTs to rise beyond their test tolerance.

Prior art improvements to the heat transfer between the DUT body and the heat sink include using an interface material, such as thermal greases and interface pad materials. However, almost all thermal greases and interface pad materials do not offer a means to repeatedly remove a heat sink connected to sequentially tested devices without contaminating the DUT package or damaging the interface material. The tackiness of a pad tends to tear it when the heat sink separates from the DUT. Furthermore, heat-sink clamping forces are typically limited to a couple of pounds per device such not to damage the DUT. This inability to apply a large clamping force gives little advantage to using such pads.

Accordingly, there remains a recognized need in the art to provide an IC tester which minimizes temperature variation at each DUT and which offers a means to repeatedly remove a heat sink connected to sequentially tested device without contaminating the DUT package or damaging the interface material.

SUMMARY OF THE INVENTION

The present invention is IC test assembly having a thermal body which is positionable adjacent an insert for holding a device under test (DUT). A phase change material (PCM) is enclosed in the thermal body to provide latent heat to the DUT. The PCM is selected to have a reasonable high latent heat and change phase within a temperature range of interest.

Selecting a phase change temperature at the desire set point for stress testing the DUT, results in the PCM storing heat energy when the test assembly is heated above the phase change temperature. In this manner, the PCM acts as a buffer delaying the test assembly from heating to a temperature above the desired set point, thereby minimizing temperature spikes above the desire set point. Likewise, when the heater is temporarily off at the upper temperature limit waiting for thermostatic activation, the amount of latent heat energy previously stored releases when the temperature in the test section drops below the phase change temperature. This release of latent heat provides an instant delay in cooling of the test assembly, and is sufficiently long so that the heater can resume heating before the DUT temperature drops. In this manner, the temperature of the test assembly is continuously maintained at the desired set point, such that there is negligible temperature variation at the DUT, as graphically depicted by FIG. 2.

In one embodiment, the present invention provides a testing apparatus for testing integrated circuits. The testing apparatus comprises a test head adapted to receive an integrated circuit under test and has a thermal body portion which includes a phase change material. The thermal body is adapted to provide latent heat from the phase change material to the integrated circuit under test.

In another embodiment, the present invention provides a testing apparatus for testing integrated circuits. The testing apparatus comprises a test head adapted to receive an integrated circuit under test. The test head has electrical contacts for making electrical connections to the integrated circuit and a thermal body portion which includes a phase change material. The thermal body is adapted to provide latent heat from the phase change material to the integrated circuit under test. Controlling circuitry is coupled to communicate with the integrated circuit by way of the electrical connections to control functions of the integrated circuit during testing. Dedicated processing circuitry is coupled through a data channel to the integrated circuit by way of the electrical connections to receive output signals from the integrated circuit during testing to determine whether the integrated circuit under test meets predetermined test criteria.

In still another embodiment, the present invention provides a testing apparatus for testing image integrated circuits. The testing apparatus comprises a heater for heating an integrated circuit under test, a test head having electrical contacts for making electrical connections to the integrated circuit under test, and a test assembly having an insert part providing a seat for positioning the integrated circuit under test. The insert part has an aperture to allow the electrical contacts to make the electrical connections to the integrated circuit under test. The test assembly also includes a pusher part which is moveable between open and closed positions relative to the insert part. The pusher part encloses a phase change material and is adapted to provide latent heat from the phase change material to the integrated circuit under test. The testing apparatus further provides controlling circuitry. The controlling circuitry is coupled to communicate with the integrated circuit by way of the electrical connections to control functions of the integrated circuit during testing.

In still another embodiment, the present invention provides a testing apparatus for testing integrated circuits. The testing apparatus comprises an insert part having a seat for positioning an integrated circuit under test, and a pusher part which is moveable between open and closed positions relative to the insert part. The pusher part encloses a phase change material and is adapted to provide latent heat from the phase change material to the integrated circuit under test when temperature fluctuates above and below a desire set point temperature such that the device under test is exposed to a substantially constant temperature.

In another embodiment, the present invention provides a method for testing integrated circuits in a test apparatus. The method comprises positioning an integrated circuit in a test assembly provided in a test section, the test assembly having a thermal body enclosing a phase change material. The method further includes making electrical connections to the integrated circuit via a test head, and thermally managing the test section at a desire set point temperature, wherein the phase change material maintains the integrated circuit at the desire set point temperature during temporary temperature fluctuations in the test section. The method also includes providing first control signals from a tester to the integrated circuit by way of the test head to control the integrated circuit during testing, transferring output signals from the integrated circuit during testing to processing circuitry by way of the test head and the processing circuitry, and analyzing the output signals in the processing circuitry to determine whether the integrated circuit passes or fails testing.

These and other features and advantages of the invention will be more fully understood from the following description of the various embodiments of the invention taken together with the accompanying drawings.

BRIEF DESCRIPTION OF THE DRAWINGS

The present invention is illustrated by way of example in which like references indicate similar elements, and in which.

DETAILED DESCRIPTION OF THE VARIOUS EMBODIMENTS

A system, device, and method for testing integrated circuits is disclosed herein. In the following description, for purposes of explanation, specific nomenclature and specific implementation details are set forth to provide a thorough understanding of the present invention. However, it will be apparent to one skilled in the art that these specific details are not required in order to practice the present invention. Also, several specific items of equipment from certain suppliers are indicated as being suitable for use in implementing the present invention, but those of ordinary skill in the art will recognize that other items of equivalent or similar function from the same or other suppliers could alternatively be employed.

Skilled artisans will also appreciate that elements in the figures are illustrated for simplicity and clarity and have not necessarily been drawn to scale. For example, the dimensions of some of the elements in the figures may be exaggerated relative to other elements to help to improve understanding of the various embodiments of the present invention.

Figure 3:
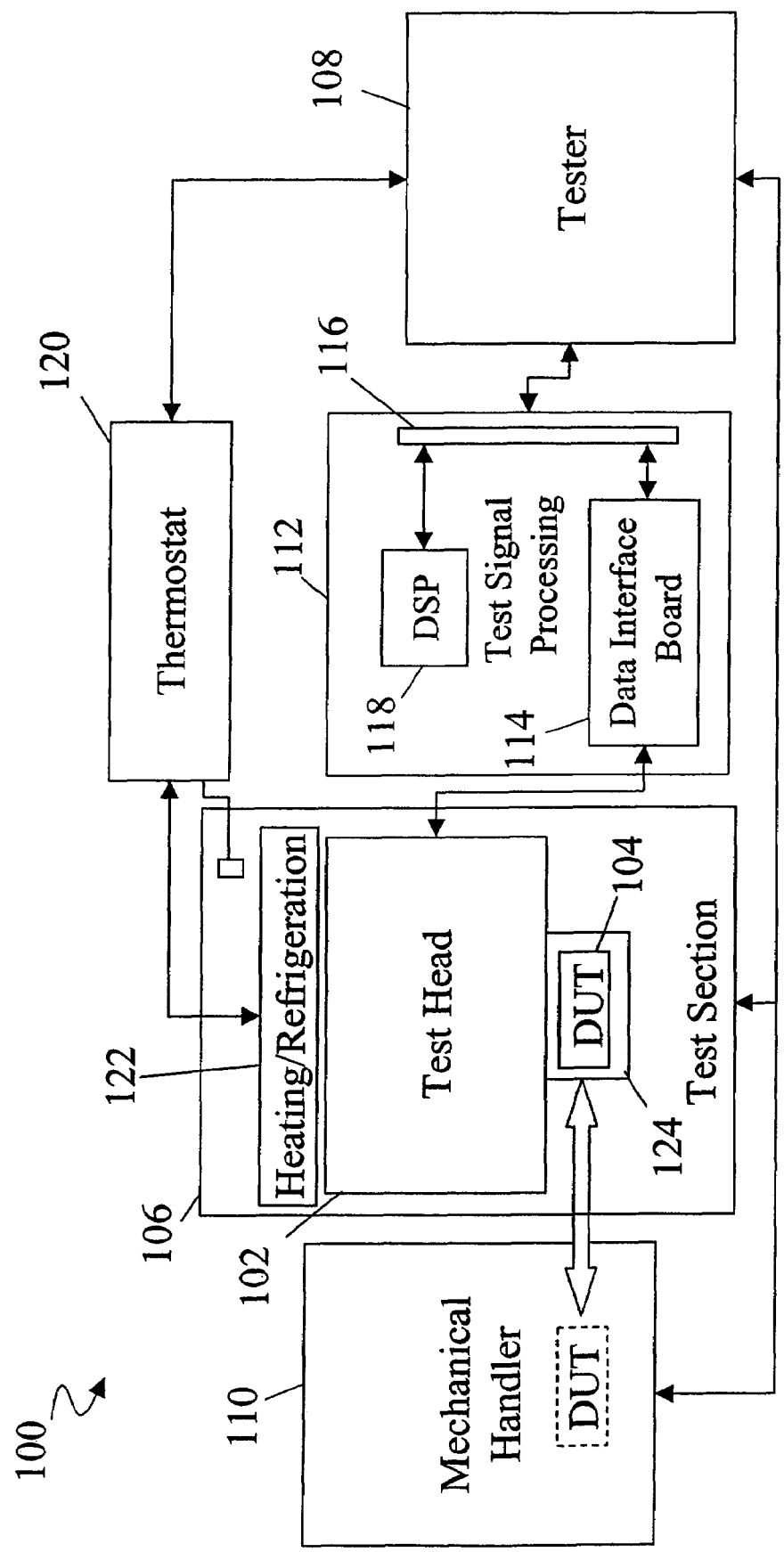
FIG. 3 is a block diagram of a IC tester in accordance with the present invention.

Referring FIG. 3, a block diagram of an integrated circuit testing apparatus or IC tester according to one embodiment of the present invention is shown, indicated generally by the reference numeral 100. The IC tester 100 is constructed particularly for the purpose of stress testing integrated circuits at a desired temperature.

The IC tester 100, includes a test-head 102 which stress tests a device under test (DUT) 104 in a temperature controlled test section 106. The device under test 104 in this case is an integrated circuit. The test-head 102 can be constructed for testing of integrated circuits when still part of the silicon wafer, or for testing the chips after the inclusion of lead connections and encapsulation. The following description relates to a test-head construction adapted for use with discrete, encapsulated integrated circuits, such as flip-chips, but it will be readily apparent to those skilled in the art that the teaching of the present invention can be also applied to testing apparatus' using a wafer test-head.

The test-head 102 has provision for seating of the DUT 104 and for making electrical connections to contact leads thereof. The test-head 102 is coupled to a tester 108, which provides electrical control signals to the test-head 102. The control signals provided to the test-head 102 from the tester 108 are effective to control operations of the test-head, as well as signals which are passed to the DUT 104 during testing. The tester 108 also controls a mechanical handler 110 which operates in conjunction with the test-head 102 to physically manipulate the DUT 104. In particular, the mechanical handler 110 operates to place the DUT 104 in position in the test-head 102 before the test begins, and remove the DUT from the test-head following completion of the test. In one embodiment, the mechanical handler 110 is controlled by the tester 108 so as to separate those DUT's removed from the test-head 102 according to the results of the testing, for example placing those devices which fail the testing separately from those which pass.

The test-head 102 is also coupled to a test signal processor 112, the function of which is to process signals output from the DUT 104 during testing. The signals output from the DUT 104 during testing are passed from the test-head 102 to the test signal processor 112 by way of an interface board 114 provided in the test signal processor 112. The test output data is communicated within the test signal processor 112 from the interface board 114 via an internal bus 116 to at least one digital signal processor (DSP) boards 118. The test signal processor 112 is coupled to communicate with the tester 108 which enables data to be passed between the processor 112 and tester 108 as is known in the art.

Although different manufacturers will be recognized by those skilled in the art as applicable alternatives, one suitable tester 108 for stress testing semiconductive devices at a desired temperature is manufactured by Advantest Corporation, Tokyo, Japan under the model number T5581. A suitable mechanical handler 110 is manufactured by Advantest Corporation, Tokyo, Japan under the model name M6541. A suitable test signal processor 112, is a Pentium™ based computer operating under a Windows NT™ operating system. Finally, a suitable DSP board 118 may comprise, for example, a Daytona single or dual TMS320C6701 PCI-based product available from Spectrum Signal Processing Inc, providing at least 2×1 gigaflops of processing power.

The IC tester 100 also includes a thermal management system for regulating the test section 106 at a desired set point temperature. As illustrated, the tester 108 is also connected to a thermostat 120 to set the predetermined desired set point temperature in the test section 106. A heating and/or refrigeration unit 122 which heats or cools the test section 106 to the desired set point temperature is operably controlled by the thermostat 120 which monitors the temperate in the test section. A thermoelectric cooler/heat pump (TEC/HP) using the Peltier effect to convert electricity to temperature differential is one suitable device for unit 122, as it supplies a wide temperature capacity range of −100° C. to +200° C., however those skilled in the art will recognize that other conventional heating and cooling devices are suitable alternatives. For IC stress testing, in one embodiment the set point temperature is in the range from about −30° C. to about 125° C. The heating and/or refrigeration unit may be a separate unit provided in the test section 106 or provided integrally with the test head 102.

Figures 1, 2:
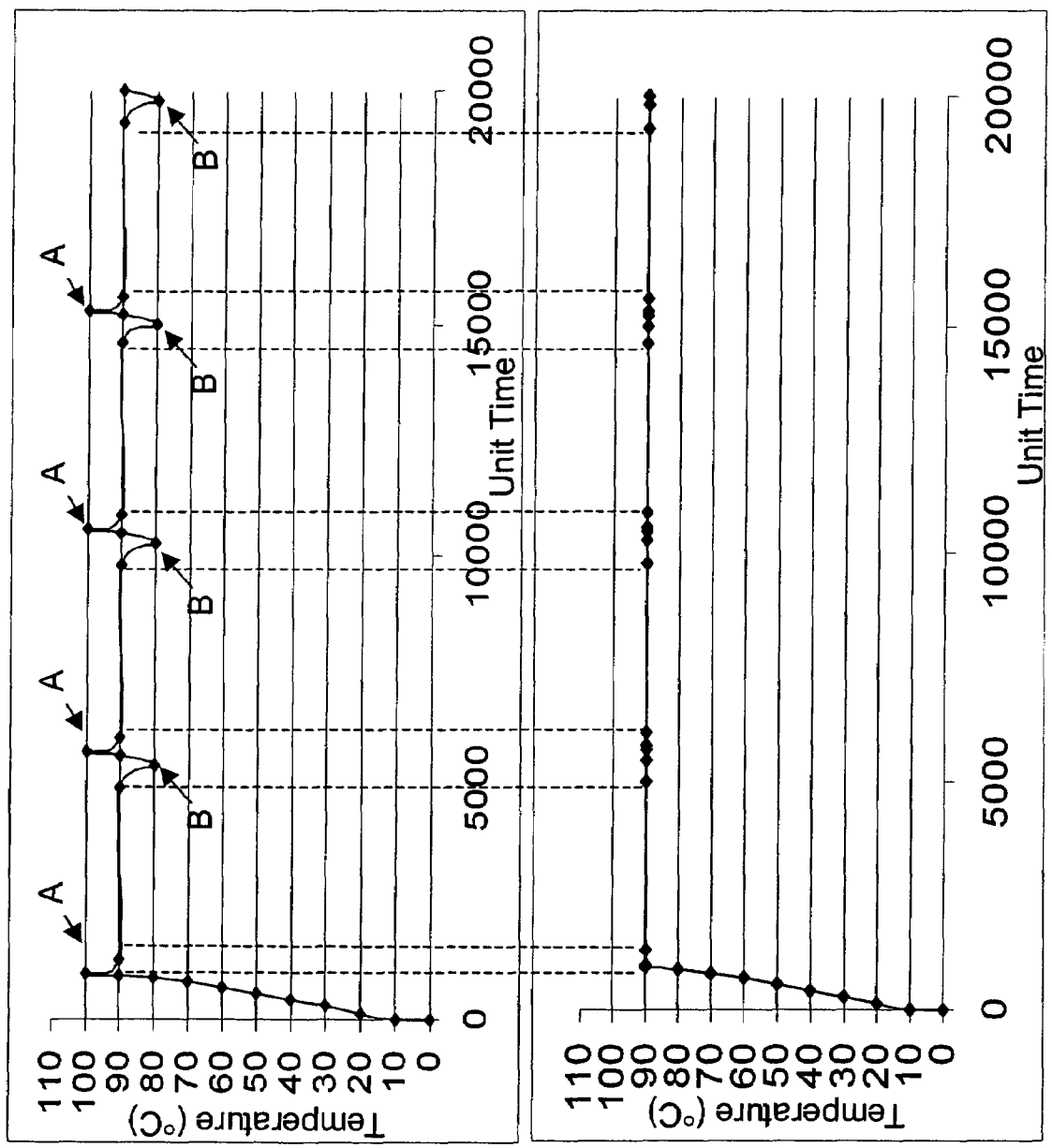
FIG. 1 is a graph of the thermal response (temperature v. time) of a heated test section of a prior art IC tester.
FIG. 2 is a graph of the thermal response (temperature v. time) of a test assembly according to one embodiment of the present invention.
Figure 4:
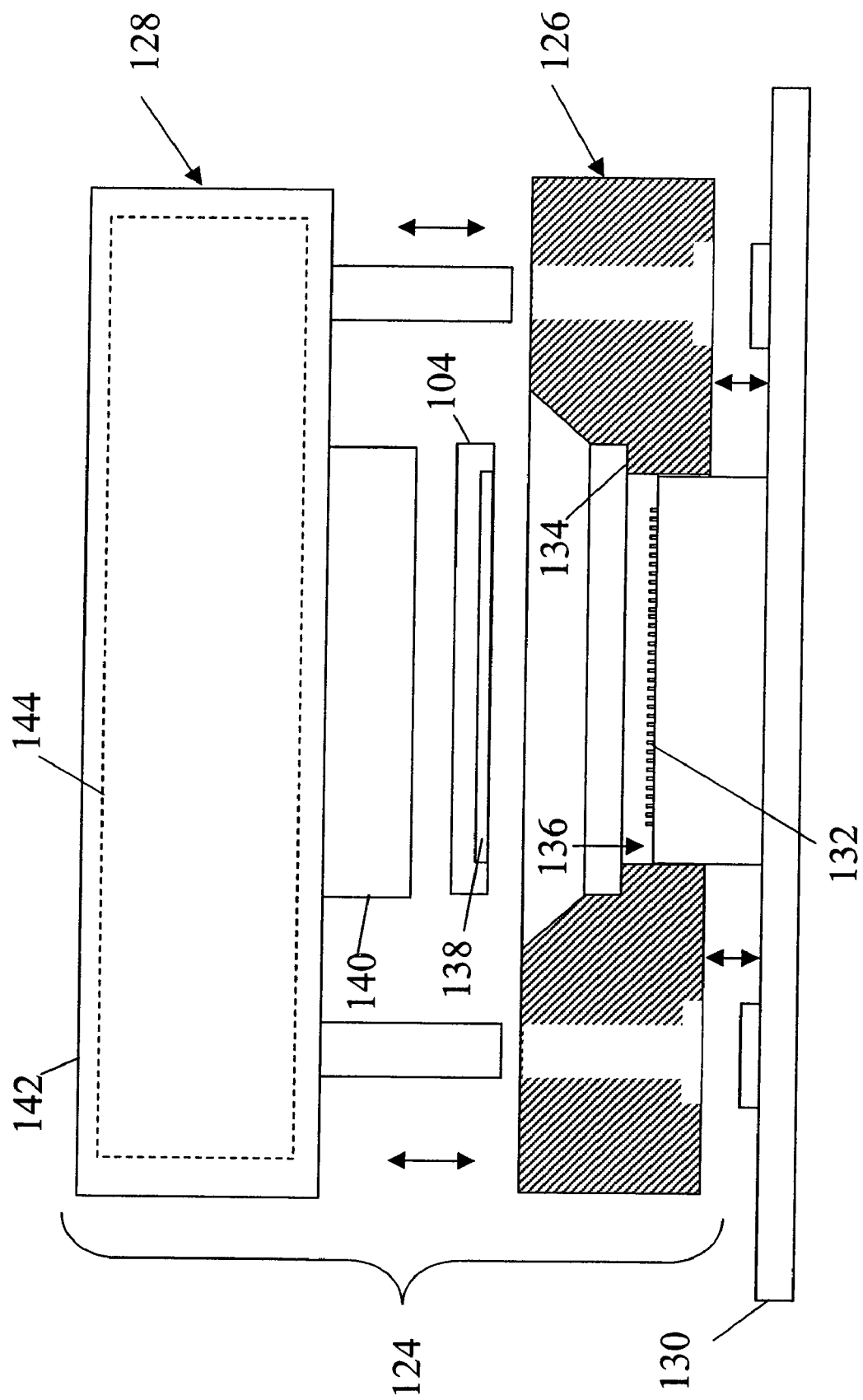
FIG. 4 is a sectional view illustrating a test assembly according to the present invention used in conjunction with a device under test.

As will be appreciated from the earlier introduction, there is a desire to minimize the effects of the heating and cooling cycle illustrated by FIG. 1 within the test section 106 in order to provide an optimal environment for stress testing integrated circuits. Accordingly, in order to provide an environment within the test section 106 which minimizes temperature variations, the DUT 104 is provided to a test assembly 124 for clamping to the test head 102, which is constructed as shown by FIG. 4. It is to be appreciated, that the test assembly 124 may form part of the test head 102 or be a separate device provided to the test head.

FIG. 4 is a conceptual view of the structure of one embodiment of the test assembly 124, shown in exploded cross-sectional profile. The test assembly 124 has two main portions: an insert part 126 and a pusher part 128. It is to be appreciated that the test assembly 124 allows electrical connections to be made to the DUT 104, but which also permits convenient insertion and removal of the DUT from the test-head 102 for fast automated testing of large numbers of integrated circuits.

As illustrated, the insert part 126 of the test assembly mounts onto an interface board 130, which is a relatively large circuit board mounted in and forming part of the test-head 102 (FIG. 3). The interface board 130 has interconnections 132 for communicating signals between the DUT 104 and the tester 108 and signal processor 112 (FIG. 3). The interface board 130 may have additional circuitry situated thereon performing interface/communication functions or the like.

The insert part 126 is formed with a seat 134, which is shaped to receive the DUT 104, and an aperture 136. When the DUT 104 is positioned in the seat 134 of the insert part 126, the interconnections 132 extend up through the aperture 134 allowing electrical connections to be conveniently made to electrical contacts 138 of the DUT 104 when sandwiched between the insert and pusher parts 126 and 128.

The pusher part 128 of the test assembly 124 is moveable in relation to the insert part 126, toward and away from the upper surface of the insert plate as indicated by the arrows. Relative movement of the insert and pusher parts 126 and 128 of the test assembly 124 is effected by the mechanical handler 110 (FIG. 3) which is controlled by the tester 108. When the insert and pusher parts 126 and 128 are positioned away from one another access is provided to the seat 134, which enables the DUT 104 to be placed in and removed from the seat. The insertion and removal of DUT's in the insert part 126 is also performed by the mechanical handler 110.

The handler 110 is controlled by the tester 108 to place a DUT 104 in the insert part seat 134 to start the stress testing procedure. The insert and pusher parts 126 and 128 of the test assembly 124 are then brought together and testing of the DUT 104 is performed, as described further below. Then, the test assembly 124 is opened again and the DUT 104 is removed from the insert part seat 134 by the mechanical handler 110. According to the results of the tests on the DUT 104, the mechanical handler 110 is then controlled by the tester 108 to place the DUT in, for example, a "pass" batch or a "fail" batch. The procedure is then repeated for the next DUT.

The pusher part 128 of the test assembly 124 has a clamping portion 140 with a lower surface in a facing relationship with the upper surface of the DUT 104. The clamping portion 140 is constructed of a heat conductive material, such as copper, steal, lead, iron, aluminum, and other heat conductive metals and materials, as will be explained in a later section. The clamping portion 140 is positioned and sized so that, when the insert and pusher parts 126 and 128 of the test assembly 124 are brought together, the clamping portion 140 aligns and clamps the DUT 104 in the insert part seat 134 such that the electrical connects 138 of the DUT make sufficient contact with the interconnections 132 of the interface board 130. Thus, signals can be communicated to and from the DUT 104 during stress testing, by way of the interface board 130 in the test head 102, from the tester 108 and test signal processor 112 (FIG. 3).

The pusher part 128 also provides a thermal body 142 having a phase change material (PCM) 144 enclosed therein to provide latent heat to the DUT 104, via conductive heating through the clamping portion 140. It is to be appreciated that in another embodiment, the clamping portion 140 may also hold a portion of the PCM 144.

The PCM 144 is selected to have a reasonable high latent heat and change phase within a temperature range of interest. For example, in one embodiment for stress testing integrated chips at a desire set point temperature of about 89° C., suitable PCMs include $Mg(NO_3)_2 \cdot 6H_2O$ and $SrBr_2 \cdot 6H_2O$. Other embodiment for stress testing integrated chips at various set point temperatures is illustrated by Table 1.

TABLE 1

| PCM | Phase Change Temp. (° C.) |
| --- | --- |
| Astorstat 6988 ™ (synthetic wax)[1] | 125 |
| Astorstat 200 ™ (synthetic wax)[1] | 92 |
| Acetamide/$CH_3CONH_2$ | 82 |
| Naphthalene/$C_{10}H_8$ | 80 |
| Propionamide/$C_2H_5CONH_2$ | 79 |
| $Ba(OH)_2 \cdot 8H_2O$ | 78 |
| Stearic acid/$CH_3(CH_2)_{16}COOOH$ | 72 |
| Phenyl benzoate/$C_6H_5COOC_6H_5$ | 71 |
| $Zn(NO_3)_2 \cdot 6H_2O$ | 36 |
| $FeBr_3 \cdot 6H_2O$ | 27 |
| TEA 0 ™ (hydrated salt)[2] | 0 |
| TEA -4 ™ (hydrated salt)[2] | -4 |
| TEA -10 ™ (hydrated salt)[2] | -10 |
| TEA -16 ™ (hydrated salt)[2] | -16 |
| TEA -21 ™ (hydrated salt)[2] | -21 |
| TEA -31 ™ (hydrated salt)[2] | -31 |

[1] Honeywell, Morristown, NJ
[2] TEAP Energy, Perth, Australia

However, those skilled in the art will readily recognize that there is a wide range of latent heat storage materials available in the industry, which include for example salt hydrates, low melting metals and alloys, poly-alcohols, eutectics and paraffins/waxes and other organic and inorganic materials, such as linear crystalline alkyl hydrocarbons, fatty acids and esters, polyethylene glycols, long alkyl side chain polymers, the solid state series of pentaerythritol, pentaglycerine, and neopentyl glycol, quaternary ammonium clathrates and semi-clathrates, which may be used depending on the desire set point temperature without departing from the spirit and scope of the present invention. As these materials differ from one another in their phase change temperature ranges and their heat storage capacities, it is to be appreciated that embodiments using a particular PCM 144 is based on the particular temperature requirement for the test procedure.

Selecting the PCM 144 with a phase change temperature at a desire set point temperature for stress testing the DUT, results in the PCM storing heat energy when the test assembly 124 is heated by heater 122 (FIG. 3) above the phase change temperature. In this manner, the PCM 144 acts as a buffer delaying the test assembly 124 from heating to a temperature above the desired set point temperature, thereby minimizing temperature spikes above the desire set point temperature, such as for example 90° C., as illustrated in FIG. 1, wherein temperature spikes are indicated by symbol A.

Likewise, when the heater 122 (FIG. 3) is temporarily off at the upper temperature limit waiting for thermostatic activation, the amount of latent heat energy previously stored by the PCM 144, releases when the temperature in the test section 106 (FIG. 3) drops below the phase change temperature of the PCM. This release of latent heat by the PCM 144 provides an instant delay in cooling of the test assembly 124 during the entire cooling cycle indicated in FIG. 1 by symbol B. In particular, the release of latent heat is sufficiently long so that the heater 122 can resume heating before the DUT 104 temperature drops.

In this manner, the temperature of the test assembly 124 is continuously maintained at the desired set point, such that there is negligible temperature variation realized by the DUT 104 when enclosed in the test assembly 124. The temperature response of the test assembly 124 to these heating and cooling cycles is graphically depicted between the sets of parallel dashed lines in FIG. 2, illustrating a substantially uniform temperature value during the stress test period.

Accordingly, a test assembly 124 designed according to the principles of the present invention provide an IC tester 100 which minimizes temperature variation at each DUT. Additionally, enclosing the PCM 144 in the thermal body 142 of the pusher part 128 provides a repeatedly removable heat sink which is connectable to sequentially tested devices without contaminating the DUT package or damaging the interface material. Furthermore, any other type of a test assembly of an IC tester filled with a phase change material is an applicable alternative, and is believe to be within the spirit and scope of the present invention.

The foregoing description of the embodiments of the invention was chosen to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method for testing integrated circuits in a test apparatus, the method comprising:
    positioning an integrated circuit in a test assembly provided in a test section, the test assembly having a thermal body enclosing a phase change material;
    making electrical connections to the integrated circuit via a test head;
    thermally managing the test section at a desire set point temperature, the phase change material maintaining the integrated circuit at the desire set point temperature during temporary temperature fluctuations in the test section;
    providing first control signals from a tester to the integrated circuit by way of the test head to control the integrated circuit during testing;
    transferring output signals from the integrated circuit during testing to processing circuitry by way of the test head and the processing circuitry; and
    analyzing the output signals in the processing circuitry to determine whether the integrated circuit passes or fails testing.

2. A method as claimed in claim 1 wherein the tester communicates testing parameters and pass/fail test limits to the processing circuitry and the processing circuitry communicates to the tester indications of whether the integrated circuit under test passes or fails testing according to the output signal analysis.

3. A method as claimed in claim 1 further comprises inserting and positioning the integrated circuit under test with a mechanical handler to make connection to the electrical contacts.

4. A method as claimed in claim 1 further comprises removing the integrated circuit following completion of testing with a mechanical handler; and controlling the removing operation of the mechanical handler by the tester according to indications of whether the integrated circuit under test passes or fails testing.

5. A method as claimed in claim 1 further comprises selecting the phase change material to a have a phase change at the desired set point temperature.

6. A method as claimed in claim 1 further comprises selecting the phase change material from a group consisting of salt hydrates, low melting metals and alloys, poly-alcohols, eutectics and paraffin.

7. A method as claimed in claim 1 further comprises selecting the phase change material from materials having a phase change in the range from about −30° C. to about 125° C.

8. A method as claimed in claim 1 further comprises selecting the phase change material from a group of materials consisting of $Mg(NO_3)_2.6H_2O$, $SrBr_2.6H_2O$, Acetamide/$CH_3CONH_2$, Naphthalene/$C_{10}H_8$, Propionamide/$C_2H_5CONH_2$, $Ba(OH)_2.8H_2O$, Stearic acid/$CH_3(CH_2)_{16}COOOH$, Phenyl benzoate/$C_6H_5COOC_6H_5$, $Zn(NO_3)_2.6H_2O$, $FeBr_3.6H_2O$, synthetic waxes, and hydrated salts.

* * * * *